United States Patent
Gabrys et al.

(10) Patent No.: US 9,952,255 B2
(45) Date of Patent: Apr. 24, 2018

(54) MAGNETICALLY SHIELDED PROBE CARD

(71) Applicant: Texas Instruments Incorporated, Dallas, TX (US)

(72) Inventors: Ann Margaret Gabrys, Woodside, CA (US); Mark William Poulter, Orinda, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 94 days.

(21) Appl. No.: 14/928,442

(22) Filed: Oct. 30, 2015

(65) Prior Publication Data

US 2017/0122982 A1    May 4, 2017

(51) Int. Cl.
  *G01R 31/00*    (2006.01)
  *G01R 1/073*    (2006.01)
  *G01R 31/28*    (2006.01)

(52) U.S. Cl.
  CPC ..... *G01R 1/07342* (2013.01); *G01R 31/2889* (2013.01)

(58) Field of Classification Search
  CPC ............ G01R 1/06772; G01R 1/07342; G01R 1/06711; G01R 1/067; G01R 1/06733; G01R 1/18; G01R 31/2886; G01R 1/07307; G01R 31/2889; G01R 1/0408; G01R 31/2865; G01R 31/2884; G01R 1/07314; G01R 31/2893; G01R 1/06705; G01R 1/06727; G01R 1/073; G01R 1/0735; G01R 31/26; G01R 31/2601; G01R 31/2656; G01R 31/275; G01R 31/2851; G01R 31/2862; G01R 31/2874; H01L 21/67271; H01L 21/6835; G06F 11/221
  See application file for complete search history.

(56) References Cited

U.S. PATENT DOCUMENTS

| 1,731,577 | A | | 3/1988 | Logan |
| 5,280,236 | A | | 1/1994 | Takahashi et al. |
| 5,949,245 | A | * | 9/1999 | Liu ..................... G01R 1/07342 324/756.03 |
| 6,194,907 | B1 | * | 2/2001 | Kanao ................ G01R 31/2886 324/627 |

(Continued)

FOREIGN PATENT DOCUMENTS

| JP | 4338662 A | | 11/1992 |
| JP | 2000304771 | * | 11/2000 |

(Continued)

OTHER PUBLICATIONS

Notification of Transmittal of the International Search Report and the Written Opinion of the International Searching Authority, or the Declaration, dated Jan. 26, 2017.

*Primary Examiner* — Vinh Nguyen
(74) *Attorney, Agent, or Firm* — Rose Alyssa Keagy; Charles A. Brill; Frank D. Cimino

(57) ABSTRACT

A probe card includes a mechanical support fixture having an inner aperture with a plurality of probes secured to the fixture that includes probe tips that extend into the inner aperture for contacting probe pads on die of a wafer to be probed. At least one magnetic shield includes a magnetic material that at least substantially surrounds a projected volume over an area that encloses the probe tips. The magnetic material has a relative magnetic permeability of at least 800.

16 Claims, 4 Drawing Sheets

(56) References Cited

U.S. PATENT DOCUMENTS

| | | | |
|---|---|---|---|
| 6,781,392 B1 | 8/2004 | Cheng et al. | |
| 7,453,275 B2 | 11/2008 | Yamaguchi | |
| 7,652,491 B2 * | 1/2010 | Kanev | G01R 31/2889 |
| | | | 324/750.26 |
| 7,741,860 B2 | 6/2010 | Giessmann et al. | |
| 2008/0116917 A1 | 5/2008 | Kanev et al. | |
| 2009/0046246 A1 * | 2/2009 | Ross | A61B 3/10 |
| | | | 351/200 |
| 2010/0164519 A1 | 7/2010 | Sellathamby et al. | |
| 2015/0054538 A1 | 2/2015 | Pagani | |

FOREIGN PATENT DOCUMENTS

| | | |
|---|---|---|
| JP | 2000304771 A | 11/2000 |
| WO | 2012110465 A2 | 8/2012 |

\* cited by examiner

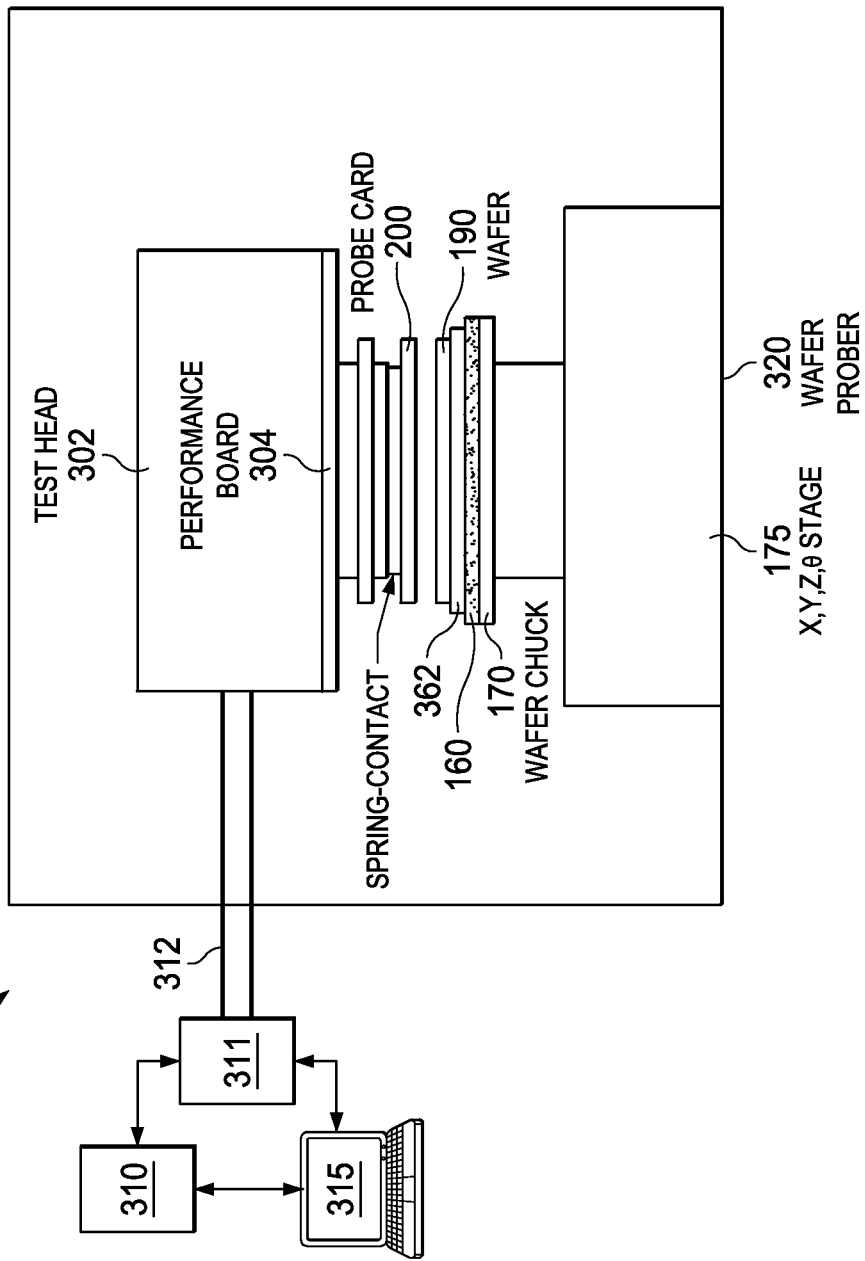

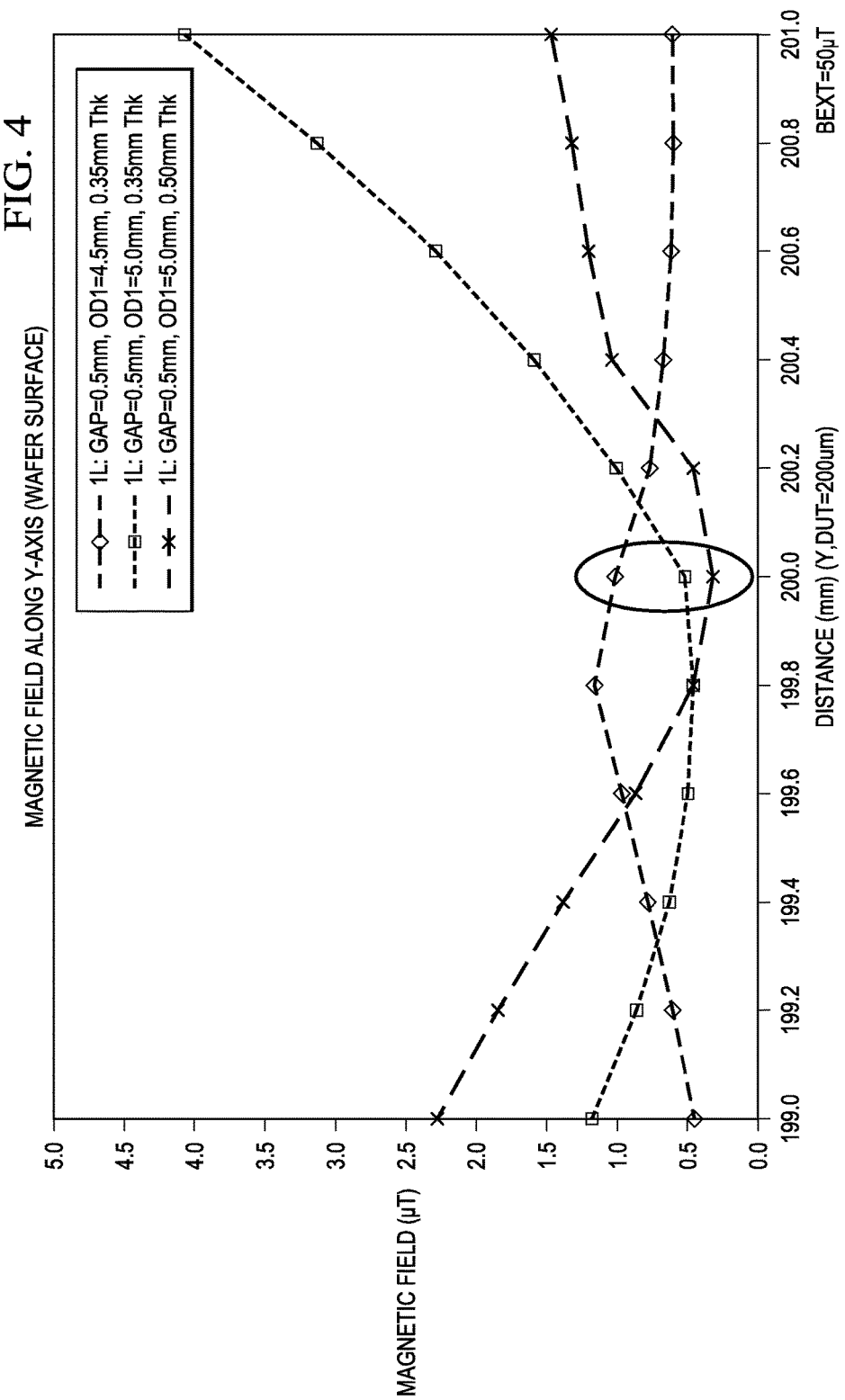

MAGNETICALLY SHIELDED PROBE CARD

FIELD

Disclosed embodiments relate to probe cards for probing semiconductor wafers having integrated circuit (IC) die that include at least one magnetically sensitive portion.

BACKGROUND

During a semiconductor fabrication process semiconductor die are formed on a wafer by processing including photolithography, deposition, implantation and etching. The wafer is a substrate generally formed of a semiconductor, such as silicon or gallium arsenide. After the fabrication process is completed and before the wafer is singulated into die (or chips), the wafer has functional tests to verify their electrical performance within a design specification. Conventionally, a test head of a test apparatus for die probing usually mounts a probe card with a plurality of probe needles or other contact members for contacting with probe pads (bond pads or bumps) on the die. The probe card provides electrical connections for interfacing between the test apparatus and the device (die) under test (DUT).

A probe card includes a probe card board (e.g. printed circuit board (PCB)) with a hollow center having a plurality of probe card needle tips that emerge from the center, extending downward, and are arranged to contact the probe pads on the die to be probed. One probe arrangement is an epoxy card PCB with a ring assembly. The ring assembly is built by placing preformed probes into a plastic template. Holes corresponding to the pattern of the bond pads of the die to be tested are punched into the template. A ceramic or anodized aluminum ring is epoxied to the probes. The ring and epoxy are configured to hold the probes in their proper orientation permanently.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize some integrated circuit (IC) devices (such as magnetic "fluxgate" sensors) need ambient magnetic field levels reduced to <50 µT to 100 µT to properly perform magnetically sensitive electrical measurements. One known arrangement for providing such reduced ambient field levels assembles the sensor device in a package, and places the packaged sensor device along with its test board within a large-scale concentric cylindrical magnetic shield (shield enclosure) typically capped at either one or both ends, where it is tested while being within. The shield enclosure solution is recognized as being an expensive arrangement (build cost plus package assembly cost) with low test throughput because typically a single packaged device is manually inserted into a test socket of the test board which is then inserted into the shield enclosure. Additionally, the process of assembly of the IC device eliminates any possible wafer location information, which makes test correlation to wafer processing effects and sources of yield loss difficult if not possible to be obtained.

Disclosed embodiments include magnetically shielded probe cards (shielded probe cards) that integrate a magnetic material (e.g., MuMETAL® or similar magnetic material)) as magnetic shield layer(s) into the design of the probe card itself, with an inner shield layer proximate to the probe pads of the device (die) under test (DUT). Disclosed shielded probe cards shield the DUT region from unintentional ambient magnetic fields, including earth's magnetic field and ambient tester fields, as well as attenuating magnetic fields generated by current running through traces on the shielded probe card itself.

Disclosed shielded probe cards can comprise a mechanical support fixture having an inner aperture with a plurality of probes secured to the fixture that include probe tips that extend into the inner aperture for contacting probe pads on die of a wafer to be probed. At least one magnetic shield includes a magnetic material that at least substantially surrounds a projected volume projected 90 degrees above an area that encloses the probe tips (see FIG. 2 described below). As used herein "substantially surrounding" refers to at least 80% of the length of the corresponding fully enclosed shape such as the circumference (or perimeter) of a circular (ring-shaped) magnetic shield in one particular embodiment. The magnetic material has a relative magnetic permeability of at least 800.

BRIEF DESCRIPTION OF THE DRAWINGS

Reference will now be made to the accompanying drawings, which are not necessarily drawn to scale, wherein:

FIG. 3 depicts an example probe system including a disclosed shielded probe card shown as the shielded probe card in FIG. 2, according to an example embodiment.

FIG. 4 shows the magnetic field strength at the z-height of the device under test (DUT) as a function of the radial distance from the DUT when probing a wafer using a disclosed shielded probe card, according to an example embodiment.

DETAILED DESCRIPTION

Figure 1A:
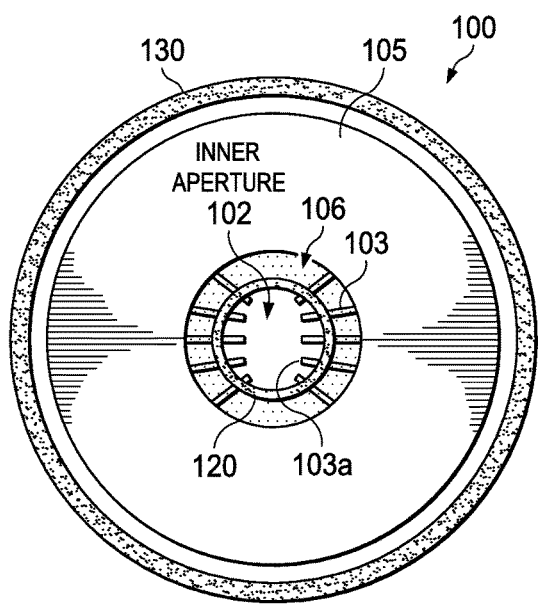
FIG. 1A is a top view of an example magnetically shielded probe card including both an inner magnetic shield and an outer magnetic shield, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A is a top view of an example shielded probe card 100 including both an inner magnetic shield 120 and an outer magnetic shield 130, according to an example embodiment. Shielded probe card 100 comprises a mechanical support fixture comprising a dielectric or a dielectric/conductor fixture (fixture) 105 with an inner assembly 106 to secure the probe tips 103*a* of a plurality of probes 103 (e.g., tungsten probes). For example, shielded probe card 100 can comprise a ceramic fixture having an inner aperture (or cavity) 102 with the probes 103 embedded within the inner assembly 106 of the fixture 105. The probe tips 103*a* extend into the inner aperture 102 for contacting probe pads (bond pads or solder bumps) on die of a wafer to be probed. The unshaded region depicted between the fixture 105 and outer magnetic shield 130 represents a dielectric that is included when the fixture 105 does not comprise a dielectric material (e.g. comprises metals such as aluminum or stainless steel). This dielectric is not necessarily solid or continuous, and can comprise a silicone film, ceramic, etc.

The inner magnetic shield 120 and outer magnetic shield 130 both comprise a magnetic material that at least substantially encloses a projected volume (see projected volume 240 in FIG. 2 described below) over an area that encloses the probe tips 103*a* by completely surrounding the projected volume, shown in a concentric arrangement (having a common center) providing a continuous ring. However, a continuous magnetic shield ring is not a requirement, although the attenuation performance of the shielded probe card generally drops significantly with the size of any gap or slotting in the magnetic shield. Some limited degree of gap or notching/slotting along the length of the magnetic shield may be generated during mechanical assembly.

The thickness of the magnetic material is generally between 0.05 mm and 3 mm, and is typically 0.5 mm to 3 mm thick. The magnetic material can be provided in a foil configured in a shielded can form (e.g., either round or rectangular shapes) for the inner magnetic shield 120 or in sheet form to provide the desired area coverage for the outer magnetic shield 130. For example, MuMETAL® is commercially alloy available from Magnetic Shield Corporation Bensenville, Ill., in a variety of forms, including shielded can and sheet form in gauges from 0.36 mm to 1.57 mm.

Given probe card embodiment as shown in FIG. 1, inner magnetic shield 120 can be physically mounted to the fixture 105 by various ways, including a pressure fit assembly to either fixture 105, to pressure-fit supports built into fixture 105, or through application of adhesive. Outer magnetic shield 130 can be physically attached to the outside of fixture 105 through a similar attachment.

As noted above, the magnetic material has a relative magnetic permeability of at least 800. In some embodiments the relative magnetic permeability of the magnetic material is at least 5,000, such as MuMETAL® which comprises a nickel-iron soft magnetic alloy, about 50% to 80% nickel, that has a relative magnetic permeability ranging from about 5,000 to about 400,000. In other embodiments the magnetic permeability is between 800 and 5,000, such as comprising an ultra-low carbon steel shielding material that has quoted magnetic permeability values of ~1,000 marketed as AMUNEAL®.

The inner magnetic shield 120 can comprise a hollow sleeve positioned within the inner aperture 102 that is secured to the fixture 105, such as by a pressure fit. The inner magnetic shield 120 can have an outer diameter of 3 mm to 8 mm. The outer magnetic shield 130 is physically mounted onto a surface of the fixture 105, or is supported by some surface of the shielded probe card 100. It may also be possible to embed magnetic material for the outer magnetic shield 130 to be within the fixture 105 through lamination.

Figure 1B:
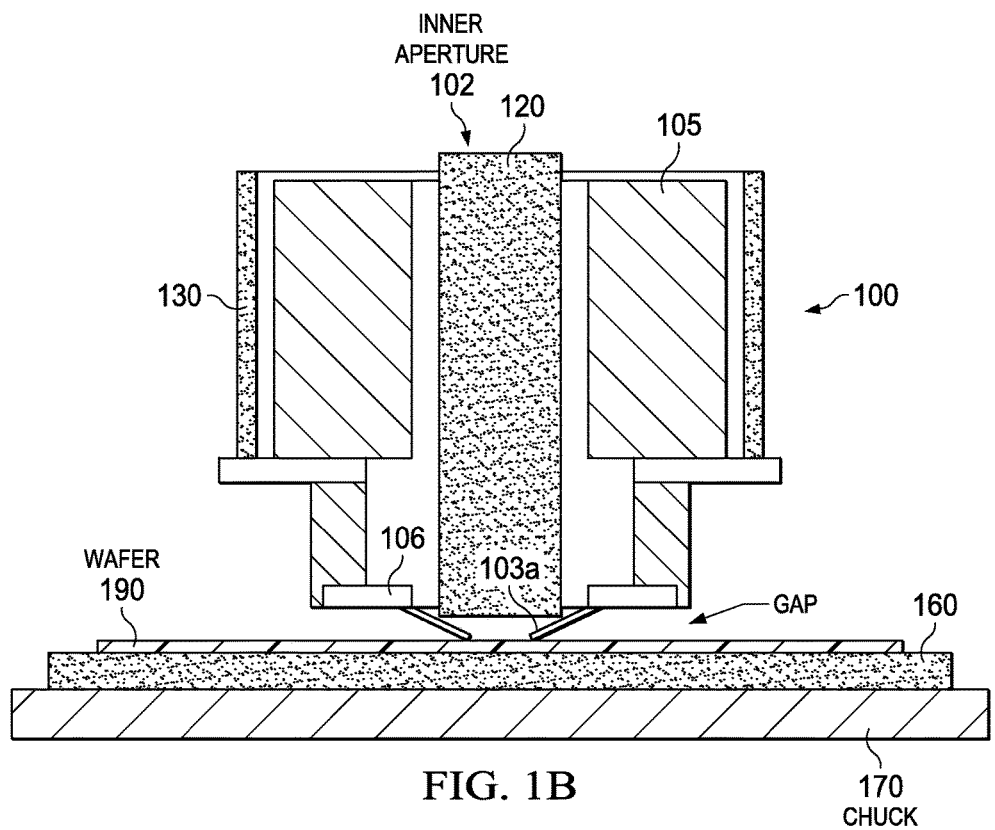
FIG. 1B is a cross sectional view of the example shielded probe card shown in FIG. 1A over a wafer that is on chuck that also has a disclosed magnetic shield, according to an example embodiment.

FIG. 1B is a cross sectional view of the example shielded probe card 100 shown in FIG. 1A over a wafer 190 that is on a wafer chuck 170 that also has a disclosed magnetic shield 160 shown below the wafer 190, according to an example embodiment. The magnetic shield 160 can comprise a flat disc of magnetic material (solid or perforated) of sufficient magnetic permeability. The magnetic shield 160 can also be coated with a dielectric material (e.g. polytetrafluoroethylene (PTFE, trade name TEFLON) to electrically isolate it from the wafer and/or wafer chuck (see dielectric layer 362 shown in FIG. 3 described below). The magnetic shield 160 can be attached in a variety of ways including mechanical clamping, by a chuck vacuum with a shield vacuum hole design allowing some thru-holes to enable a vacuum to hold the wafer on top of a shield disc, and adhesion.

There can be more than two concentric magnetic shield layers if there is enough room within the inner aperture 102 and the shield material is thin enough. For cases where there are multiple shield layers (≥2), the innermost magnetic shield layers can be physically attached to the outer magnetic shield layers only (e.g., using a dielectric spacer material, such as TEFLON, epoxy, silicone, etc.), without the need to physically mount them to any probe card surface. Only one of the shield layers in this embodiment is generally mounted to a surface of the probe card.

Figure 2:
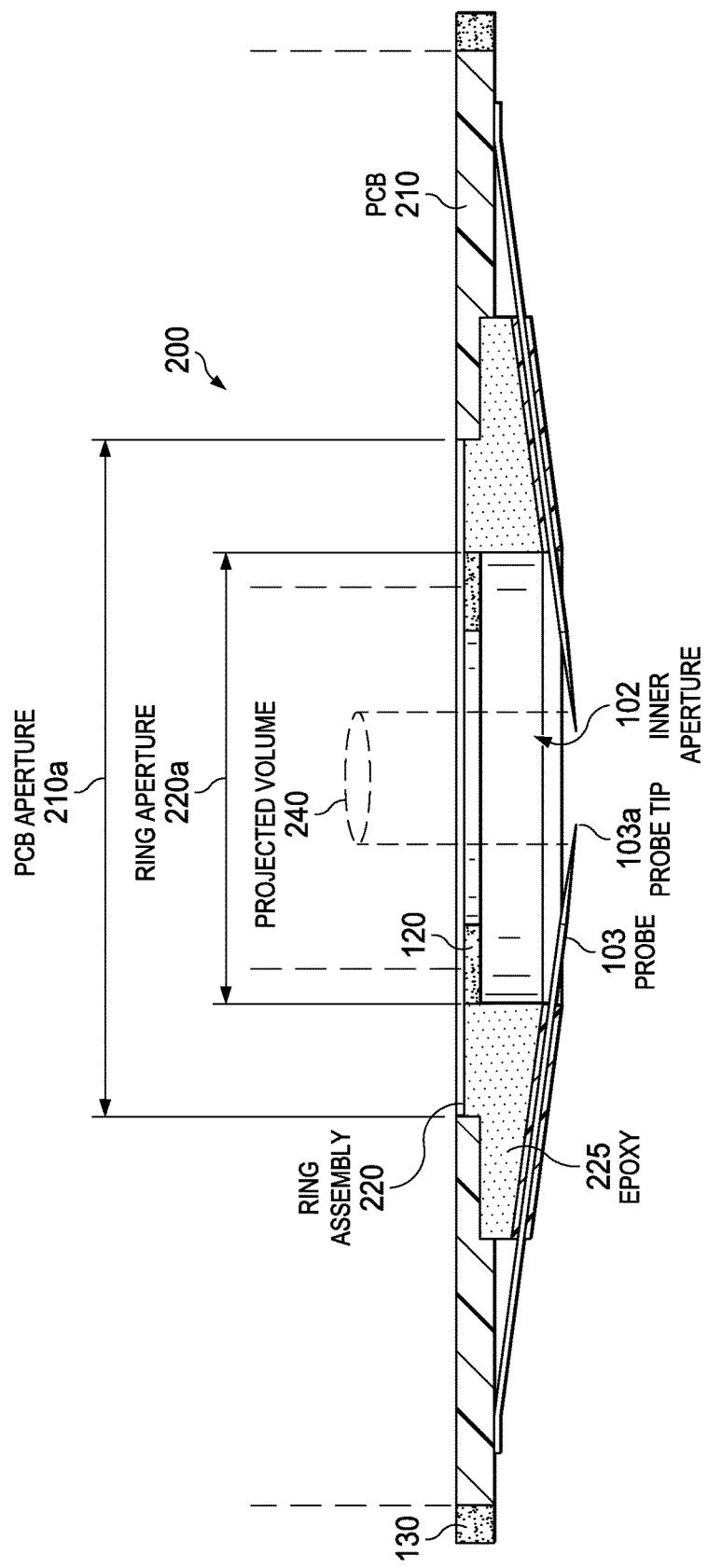
FIG. 2 shows an example shielded probe card including both an inner and an outer magnetic shield embodied as an epoxy card with ring assembly, according to an example embodiment.

FIG. 2 shows an example shielded probe card 200 including both an inner magnetic shield 120 and an outer magnetic shield 130, embodied as a PCB probe card with epoxy ring assembly comprising a PCB 210 and ring assembly 220, according to an example embodiment. The ring assembly 220 fits in the PCB aperture 210*a*, and the ring assembly 220 has its own ring aperture 220*a* that defines the inner aperture 102. Probes 103 are secured to the ring assembly 220 by epoxy 225. A projected volume over an area that encloses the probe tips 103*a* of the probes 103 is shown as 240. The inner magnetic shield 120 and an outer magnetic shield 130 are both shown to enclose the projected volume 240, both being concentric with the projected volume 240.

Inner magnetic shield 120 should generally be as close as possible, or coincident with the projected volume 240 to maximize the magnetic attenuation provided. The z-height of inner magnetic shield 120 should generally be extended down to be as close as possible to the probe tips 103*a* (without ever touching) to minimize the gap between inner magnetic shield 120 and the DUT and extended up as the design dictates to maximize magnetic attenuation while still fitting within the confines of the probe system. An example range for the z-height (perpendicular to the plane of the wafer) of the inner magnetic shield 120 above the wafer 190 is from 150 μm to 1.5 mm, dependent at least in part on the depth of the probe tips 103*a*, the z-thickness of the PCB 210, and the probe card design. Outer magnetic shield 130 should generally similarly be extended beyond the z-thickness of the PCB 210.

For probe card configurations with sufficiently small inner apertures 102 with sufficient probe length underneath the fixture material, the inner magnetic shield 120 can be a shield layer that sits on top of the fixture material (e.g., on ring assembly 220), effectively enclosing the inner aperture 102. This arrangement increases the distance of the inner magnetic shield to the DUT, but this design can potentially compensate for the associated decrease in the attenuation rating (or might not, depending on the ambient field requirements of the test).

A disclosed shielded probe card has several advantages compared to a known shielded probe system. A shielded probe card can be used on multiple different probe systems by simply relocating the probe card. Additionally the probe card design can be modified for similarly designed probe cards. This is a significantly less expensive solution than either purchasing an enclosure that fully shields the probe system or retrofitting an existing probe system with such a shielded enclosure.

A disclosed shielded probe card also places the magnetic shield as close as is possible to the DUT, which isolates the DUT from almost all external fields. A conventional outer shielded enclosure in contrast still leaves the DUT subject to fields generated by the probe card and cabling inside of the enclosure. A disclosed shielded probe card may be particularly important for wafer-level test systems that include an optics port over the DUT, which cannot be blocked by a conventional shielded enclosure.

FIG. 3 depicts an example probe system 300 including a wafer prober 320 including a disclosed magnetically shielded probe card shown as the shielded probe card 200 in FIG. 2, according to an example embodiment. Shielded probe card 200 is shown including a test (or probe) head 302 on a performance board 304. In a typical parametric probe system, the test head 302 docks directly to the probe card so that no performance board 304 is needed. Disclosed shielded probe card 200 can be applied to either a product multi-probe system or to a device parametric test system.

For system 300 signals are received by the performance board 304 from a test controller such as automatic test equipment (ATE) 310 via lead lines 312 which may include digital, high frequency, high precision analog, RF and/or power paths. In a parametric probe system (without a performance board 304), signals are routed directly from the test head 302 without need for lead lines 312. Probe card 200 has contact points provided by probe tips 103a of the probes 103 in a specific array to mirror the corresponding contact points of a specific design of the DUTs on the wafer 190. The wafer 190 is on an optional dielectric layer 362 such a TEFLON sheet or coating on a magnetic shield layer 160 (e.g., MuMETAL®) that is on a wafer chuck 170 that is on an X, Y, Z, θ stage 175. The probes 103 may be conventionally soldered to the PCB 210. The wafer chuck 170, dielectric layer 362 and magnetic shield layer 160 may be patterned to allow a vacuum to be pulled on the backside of the wafer 190 from below.

The probe system 300 is also shown including a computer unit 315 for controlling the ATE 310 and the test control unit 311. A parametric probe system can be operated without a controlling PC such as computer unit 315, only needing parametric test instrumentation and manual X, Y, Z, θ control of the wafer chuck 160. The test controls signals and test data is delivered to and from the ATE 310 and DUTs on the wafer 190 through the lead lines 312 and the shielded probe card 200.

FIG. 4 shows the magnitude of the magnetic field at the z-height of the DUT as a function of the radial distance parallel to the wafer surface when probing the wafer using a disclosed magnetically shielded probe card, with an external B-field (Bext)=50 µT, according to an example embodiment. Simulation data is shown for combinations of the inner magnetic shield 120 outer diameter and shield layer thicknesses. A B-field of <500 nT (<1% of Bext) is shown reaching the DUT surface. This high level attenuation of Bext provided by the shielded probe card enables measurement of extremely sensitive magnetic components at wafer level, substantially improving throughput and ability to correlate device metrics to wafer level processes. It also decreases existing learning cycles, since package assembly time is no longer needed to acquire data, and enables complete characterization of process splits.

Disclosed embodiments can be used to test a variety of different IC devices and related products. The IC die on the wafers may include various elements therein and/or layers thereon, including barrier layers, dielectric layers, magnetic layers, device structures, active elements and passive elements including source regions, drain regions, bit lines, bases, emitters, collectors, conductive lines, conductive vias, etc. Moreover, the IC die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A probe card, comprising:
 a mechanical support fixture having an inner aperture with a plurality of probes secured to said fixture that include probe tips that extend into said inner aperture for contacting probe pads on die of a wafer to be probed, and
 at least one magnetic shield comprising a magnetic material that at least substantially surrounds a projected volume over an area that encloses said probe tips of said probes,
 wherein said magnetic material has a relative magnetic permeability between 800 and 5,000.

2. The probe card of claim 1, wherein said magnetic shield comprises a hollow sleeve positioned within said inner aperture that is secured to said fixture.

3. The probe card of claim 1, wherein said magnetic shield is physically mounted onto a surface of said fixture.

4. The probe card of claim 1, wherein said magnetic shield comprises a first magnetic shield including a hollow sleeve positioned inside said inner aperture that is secured to said fixture and a second magnetic shield that is physically mounted onto a surface of said fixture.

5. The probe card of claim 4, wherein said second magnetic shield concentrically surrounds said first magnetic shield.

6. The probe card of claim 1, wherein a thickness of said magnetic material is between 0.05 and 3 mm.

7. The probe card of claim 1, wherein said magnetic shield completely surrounds said projected volume.

8. A wafer probe system, comprising:
 a wafer prober including a test head coupled to a probe card for probing die of a wafer that is disposed on a wafer chuck;
 wherein said probe card comprises:
  a mechanical support fixture having an inner aperture with a plurality of probes secured to said fixture that include probe tips that extend into said inner aperture for contacting probe pads on die of a wafer to be probed, and
  at least one magnetic shield comprising a magnetic material that at least substantially surrounds a projected volume over an area that encloses said probe tips of said probes, wherein said magnetic material has a relative magnetic permeability between 800 and 5,000.

9. The probe system of claim 8, wherein said wafer chuck includes a magnetic shield comprising a magnetic material that at least substantially surrounds a projected volume under said area that encloses said probe tips.

10. The probe system of claim 9, further comprising a magnetic shield on a dielectric layer on said wafer chuck.

11. The probe system of claim 8, wherein said magnetic shield comprises a hollow sleeve positioned within said inner aperture that is secured to said fixture.

12. The probe system of claim 8, wherein said magnetic shield is physically mounted onto a surface of said fixture.

13. The probe system of claim 8, wherein said magnetic shield comprises a first magnetic shield including a hollow sleeve positioned inside said inner aperture that is secured to said fixture and a second magnetic shield that is physically mounted onto a surface of said fixture.

14. The probe system of claim 13, wherein said second magnetic shield concentrically surrounds said first magnetic shield.

15. The probe system of claim 8, wherein a thickness of said magnetic material is between 0.05 mm and 3 mm.

16. The probe system of claim 8, wherein said magnetic shield completely surrounds said projected volume.

* * * * *